US008699725B2

(12) United States Patent
Kuzuryu et al.

(10) Patent No.: US 8,699,725 B2
(45) Date of Patent: Apr. 15, 2014

(54) ACOUSTIC PROCESSING APPARATUS

(75) Inventors: Yuichiro Kuzuryu, Hamamatsu (JP); Kazushi Tamai, Hamamatsu (JP); Motoyuki Niwa, Hamamatsu (JP); Yoshinobu Iwasaki, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 527 days.

(21) Appl. No.: 12/878,541

(22) Filed: Sep. 9, 2010

(65) Prior Publication Data

US 2011/0058690 A1 Mar. 10, 2011

(30) Foreign Application Priority Data

Sep. 10, 2009 (JP) ................................ 2009-209729

(51) Int. Cl.
*H03G 3/00* (2006.01)
*H04R 5/02* (2006.01)
*H04H 40/00* (2008.01)

(52) U.S. Cl.
USPC ........... 381/105; 381/311; 381/104; 381/107; 381/109; 455/3.06

(58) Field of Classification Search
USPC .......... 381/311, 104, 105, 107, 109; 455/3.06
See application file for complete search history.

(56) References Cited

U.S. PATENT DOCUMENTS

2008/0242222 A1* 10/2008 Bryce et al. .................. 455/3.06

FOREIGN PATENT DOCUMENTS

JP 2003-158800 A 5/2003

* cited by examiner

*Primary Examiner* — Vivian Chin
*Assistant Examiner* — Ammar Hamid
(74) *Attorney, Agent, or Firm* — Crowell & Moring LLP

(57) ABSTRACT

An acoustic processing apparatus includes: a connecting unit to which an instructing device is connected; a situation obtaining unit obtaining information indicative of whether a number of apparatuses connected to the instructing device is a plural number or not, from the instructing device; a receiving unit receiving an instruction value from the instructing device; a storage unit in which a set value is stored; a determining unit, in a case where the information indicates that the number of apparatuses connected to the instructing device is a plural number, comparing the instruction and set values, and determines correspondence relationship between the values in accordance with a result of comparison; a changing unit, when the receiving unit receives a instruction value after the correspondence relationship is determined, specifying a set value which corresponds to the instruction value, based on the correspondence relationship, and changes the set value stored in the storage unit to the specified set value; and an acoustic processing unit which applies an acoustic process on an input audio data in accordance with the set value.

4 Claims, 11 Drawing Sheets

ACOUSTIC PROCESSING APPARATUS

BACKGROUND OF THE INVENTION

The present invention relates to a technique of controlling set values of a plurality of acoustic apparatuses by wireless communication.

An acoustic apparatus such as a multi channel audio reproducing apparatus having a plurality of speakers is configured so that volume values of channels emitted from the speakers can be respectively set (for example, JP-A-2003-158800). In such an acoustic apparatus, the volume values of the channels are set in the configuration in the apparatus. This setting operation can be performed also by using a remote controller.

In the case where a plurality of acoustic apparatuses can be remotely operated by a remote controller, when all the acoustic apparatuses are remotely operated in the same manner by the remote controller so that the volume value is set, the same volume value which is instructed by the remote controller is set in all the acoustic apparatuses. In the case where there are a plurality of acoustic apparatuses which have different output characteristics at the same volume value, therefore, a volume balance causing an unpleasant sensation is produced. When an acoustic apparatus which has originally emitted a sound becomes under control of a remote controller, the sound volume is suddenly changed, and the listener may feel a sense of discomfort.

SUMMARY

It is therefore an object of the invention to provide an apparatus which can, in the case where a parameter that is set in an acoustic processing apparatus and that is used for applying an acoustic process is remotely controlled by an instructing device, even when the number of acoustic processing apparatuses to be controlled is increased, control parameters of the whole acoustic processing apparatuses to be controlled, while the parameter that is set in the newly added acoustic processing apparatus is prevented from being suddenly changed by an instruction value of the instructing device.

In order to achieve the object, according to the invention, there is provided an acoustic processing apparatus comprising: a connecting unit to which an instructing device is connected by wireless communication; a situation obtaining unit which, when the instructing device is connected to the connecting unit, obtains information indicative of whether a number of apparatuses connected to the instructing device by wireless communication is a plural number or not, from the instructing device; a receiving unit which receives an instruction value of a parameter from the instructing device; a storage unit in which a set value of the parameter is stored; a determining unit which, in a case where the information indicates that the number of apparatuses connected to the instructing device is a plural number, compares the instruction value and the set value, and determines correspondence relationship between the instruction value and the set value in accordance with a result of comparison of the instruction value and the set value; a first changing unit which, when the receiving unit receives a instruction value of the parameter after the correspondence relationship is determined, specifies a set value of the parameter which corresponds to the instruction value received after the correspondence relationship is determined, based on the correspondence relationship, and changes the set value stored in the storage unit to the specified set value in the storage unit; and an acoustic processing unit which applies an acoustic process on an input audio data in accordance with the set value in the storage unit.

The determining unit may determine the correspondence relationship so that the set value specified by the first changing unit is equal to the instruction value received by the receiving unit.

The acoustic processing apparatus may further include: an instructing unit which generates an instruction for changing the set value; and a second changing unit which changes the set value in the storage unit in accordance with the instruction. In the case where the information indicates that the number of apparatuses connected to the instructing device is a plural number, when the set value is changed by the second changing unit, the determining unit may compare the set value changed by the second changing unit and the instruction value, and update the correspondence relationship in accordance with a result of comparison of the set value changed by the second changing unit and the instruction value.

The acoustic processing apparatus may further include a transmitting unit. When the number of apparatuses connected to the instructing device is changed, the situation obtaining unit may obtain the information from the instructing device. In a case where the information indicates that the number of apparatuses connected to the instructing device is not a plural number, the transmitting unit may transmit the set value in the storage unit to the instructing device, and, even after the correspondence relationship is determined by the determining unit, the first changing unit may change the set value in the storage unit to the instruction value received by the receiving unit.

DETAILED DESCRIPTION OF EMBODIMENTS

Embodiment

Summary

Figure 1A:
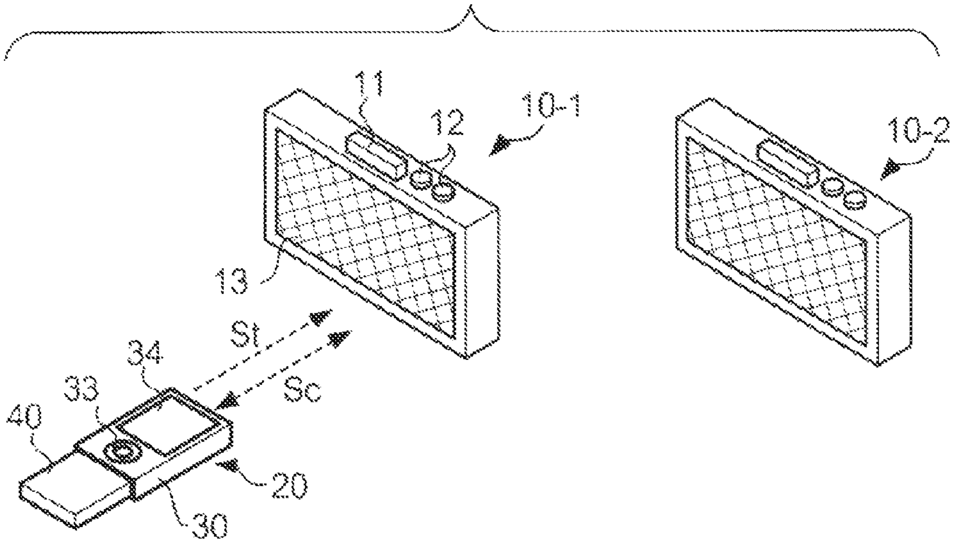
FIGS. 1A to 1C are views schematically illustrating the operation of an audio system in an embodiment.
Figure 1B:
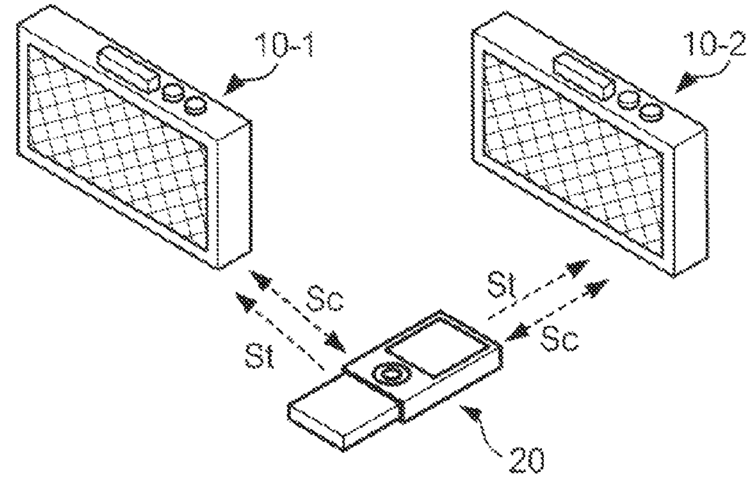
Figure 1C:
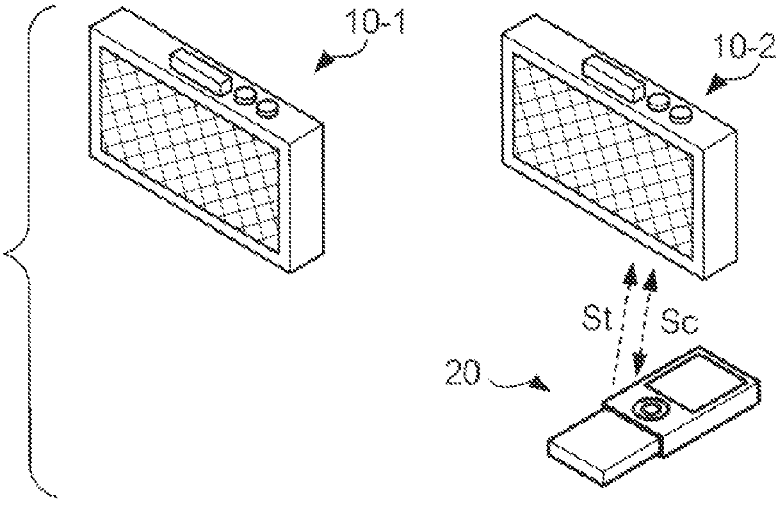

FIGS. 1A to 1C are views schematically illustrating the operation of an audio system in an embodiment. The audio system in the example has speaker apparatuses 10 and an audio apparatus 20. The audio apparatus 20 is configured by connecting a portable audio terminal 30 which outputs audio data indicating a musical sound waveform signal such as a music piece, to a communication module 40 which performs wireless communication with the speaker apparatuses 10. The apparatuses will be described in detail later. In FIGS. 1A to 1C, there are speaker apparatuses 10-1, 10-2. In the case where they are not particularly distinguished from each other, they are referred to simply as the speaker apparatuses 10.

Each of the speaker apparatuses 10 and the audio apparatus 20 has a configuration which performs wireless communication. The audio apparatus 20 is connected with the speaker apparatuses 10 which exist in the communication range of the audio apparatus, by wireless communication to constitute a network with the connected apparatuses. When a network is configured, audio data St transmitted from the audio apparatus 20 are received by the speaker apparatuses 10 constituting the network. Between the speaker apparatuses 10 and audio apparatus 20 constituting the network, a control signal Sc containing various kinds of information indicating a notification, control, instruction, or the like to the partner apparatus is transmitted and received. In this example, the information contained in the control signal Sc includes instruction value information, set value information, and connection situation information. The information will be described in detail later.

The audio apparatus 20 is an apparatus which is movable while being carried, and performs wireless communication with the speaker apparatuses 10. The number of the object to be connected is not limited to single, and may sometimes be plural. For example, the connection is performed in the following manner. When the position of the audio apparatus 20 is moved and the speaker apparatus 10-1 exists within the communication range as shown in FIG. 1A, the audio apparatus is connected to the speaker apparatus 10-1 by wireless communication. Therefore, the speaker apparatus 10-1 emits a sound in accordance with the received audio data St.

When the position of the audio apparatus 20 is further moved and both the speaker apparatuses 10-1, 10-2 exist within the communication range as shown in FIG. 1B, the audio apparatus is connected to both the speaker apparatuses by wireless communication. Therefore, both the speaker apparatuses 10-1, 10-2 emit a sound in accordance with the received audio data St. When the audio apparatus 20 is further moved, the speaker apparatus 10-1 does not exist within the communication range, and the situation shown in FIG. 1C is produced, the sound emission from the speaker apparatus 10-1 is stopped.

Hereinafter, the configurations of the speaker apparatuses 10 and the audio apparatus 20 which, under such situations, are used for realizing a volume controlling process of controlling a volume set value Ls for determining the volume level of sound emission of each of the speaker apparatuses 10 will be described.

[Configurations of Speaker Apparatuses 10]

Figure 2:
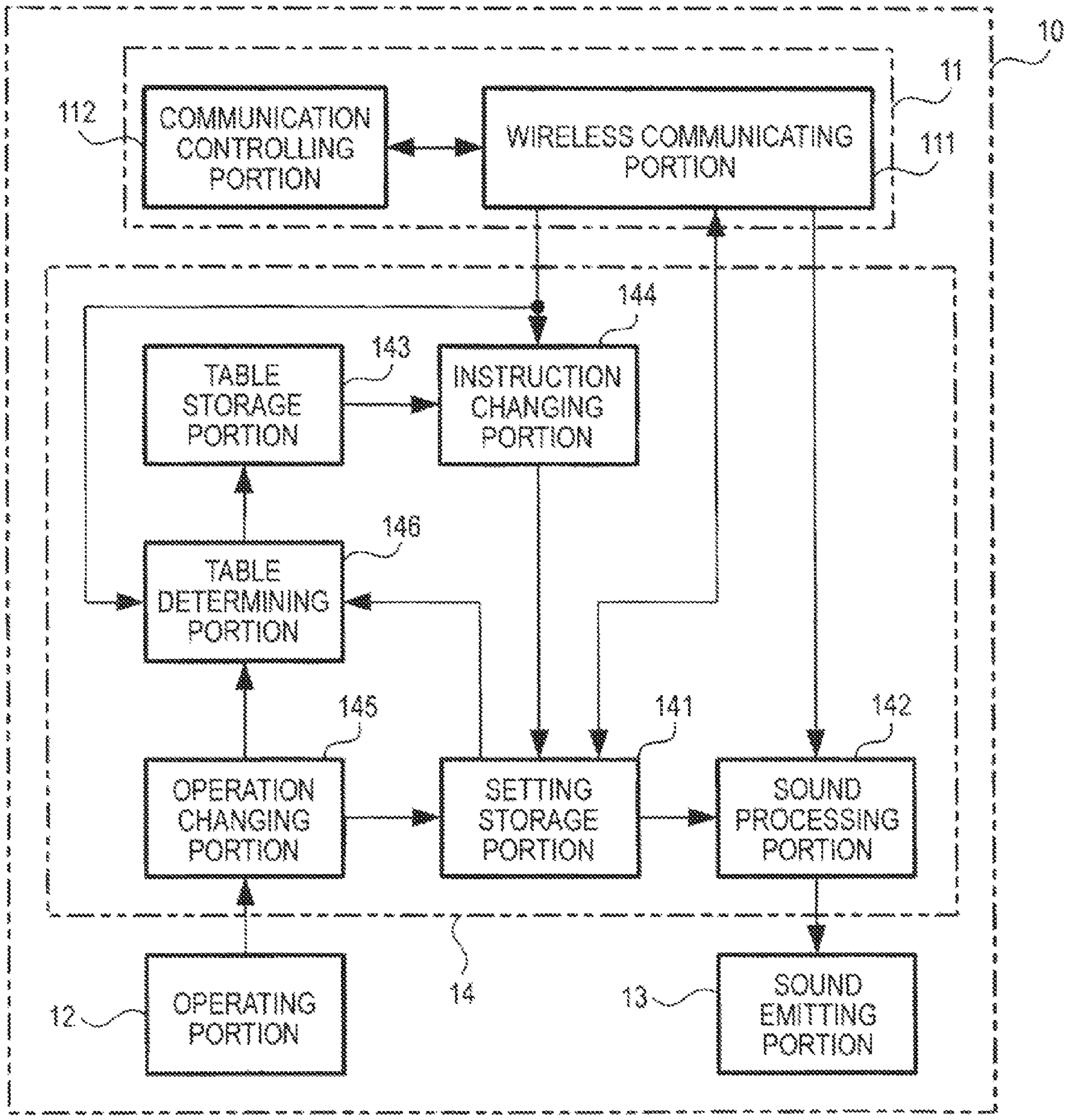
FIG. 2 is a block diagram illustrating the configuration of a speaker apparatus in the embodiment.

FIG. 2 is a block diagram illustrating the configuration of each of the speaker apparatuses 10. The speaker apparatus 10 has a communicating portion 11, an operating portion 12, a sound emitting portion 13, and a controlling portion 14. The communicating portion 11 has a wireless communicating portion 111 and a communication controlling portion 112.

The wireless communicating portion 111 has a function of, under control of the communication controlling portion 112, performing wireless communication with the audio apparatus 20. The wireless communicating portion 111 detects the audio apparatus 20 which exists in a communication range according to the strength of an output radio wave, establishes wireless communication at the physical layer level, and, under control of the communication controlling portion 112, is connected to the audio apparatus 20 by wireless communication. At this time, even when another speaker apparatus 10 exists within the communication range, the connection between the speaker apparatuses 10 is not established, and the other speaker apparatus 10 is connected to the audio apparatus 20.

In the audio system, namely, the audio apparatus 20 which is a master, and the speaker apparatuses 10 which are slaves are connected to each other by wireless communication, but the speaker apparatuses which are slaves are not connected to each other by wireless communication. In the embodiment, slave speaker apparatuses are not connected to each other by wireless communication. Alternatively, the slave apparatuses may exchange information by connecting the apparatuses to each other by wireless communication, or through the connections with the master apparatus.

Then, the audio data St are transmitted by broadcast communication in streaming form from the audio apparatus 20 which is the master apparatus as described above, to the speaker apparatuses 10 which are slave apparatuses. The control signal Sc is transmitted and received between the master apparatus and the slave apparatuses. In the example, also the control signal Sc is transmitted by broadcast communication. Alternatively, the signal may contain an identifier identifying an apparatus which is an object of the transmission and reception, so that the control signal Sc can be transmitted while substantially specifying the apparatuses.

In an apparatus which receives the control signal Sc, in the case where the identifier contained in the control signal Sc does not identify the own apparatus, for example, the reception of the control signal Sc is treated as invalid. According to the configuration, only in the apparatus corresponding to the identifier, the reception of the control signal Sc can be made valid. The identifier contained in the control signal Sc may identify a single or plurality of apparatuses, or identify all of the speaker apparatuses 10 constituting the network.

For example, the identifiers are set in the communication controlling portions 112 of the speaker apparatuses 10, and a communication controlling portion 42 (see FIG. 3) of the audio apparatus 20, and the validity/invalidity of the identifier is determined by the respective communication controlling portions 112, 42.

When the wireless communicating portion 111 receives the encoded audio data St from the audio apparatus 20, the wireless communicating portion 111 decodes the data, and outputs the decoded data to the controlling portion 14, and, when receiving the control signal Sc from the audio apparatus 20, the wireless communicating portion 111 decodes the control signal, and outputs the instruction value information, connection situation information, and the like contained in the control signal Sc to the controlling portion 14. Furthermore, the wireless communicating portion 111 encodes the control signal Sc containing the set value information and the like and output from the controlling portion 14, and transmits the encoded signal to the audio apparatus 20.

The communication controlling portion 112 controls exchanges in communication operations which are performed in the wireless communicating portion 111 as described above, such as the establishment of wireless communication, the connection with the audio apparatus 20 by wireless communication, and the transmission and reception after connection.

The operating portion 12 has operating devices (such as buttons and rotary encoders) for inputting user instructions, and outputs an operation signal corresponding to an operation on the operating devices. In the example, the operating portion has an operating device for instructing a volume adjustment, i.e., an increase or decrease of the volume set value Ls.

In the case where instructions for setting of a sound field effect which is to be added to a sound of the audio data, and input of the audio data are performed by plural means, the operating portion 12 may have an operating device for performing various instructions such as switching instructions for selecting audio data to be emitted. The operating devices may be disposed in a remote controller which can remotely control the apparatus.

The sound emitting portion 13 has an amplifying circuit which amplifies an input musical sound waveform signal, and a speaker which emits the amplified musical sound waveform signal. In the example, the amplifying circuits of the speaker apparatuses 10-1, 10-2 have different amplification factors so that, even when musical sound waveform signals of the same output level are input to the apparatuses, respectively, the sound volume levels at which the musical sound waveform signals are emitted from the respective apparatuses are different from each other. In order to perform sound emissions at the same sound volume level from the speaker apparatuses 10-1, 10-2, therefore, their volume set values Ls are different from each other.

Alternatively, the speaker apparatuses may have the same amplification factor. The number of the speakers may be single or plural. In the case of plural speakers, the speakers may configure a speaker array, so that sounds are provided with directivity and the sound emitting direction can be controlled.

The controlling portion 14 has a CPU (Central Processing Unit), a ROM (Read Only Memory), a RAM (Random Access Memory), a DSP (Digital Signal Processor), and the like. The CPU loads a control program stored in the ROM into the RAM, and executes the program, thereby realizing a volume control processing function and the like to control the portions of the speaker apparatuses 10. The volume controlling function will be described later. The configurations of the speaker apparatuses 10 have been described.

[Configuration of Audio Apparatus 20]

Figure 3:
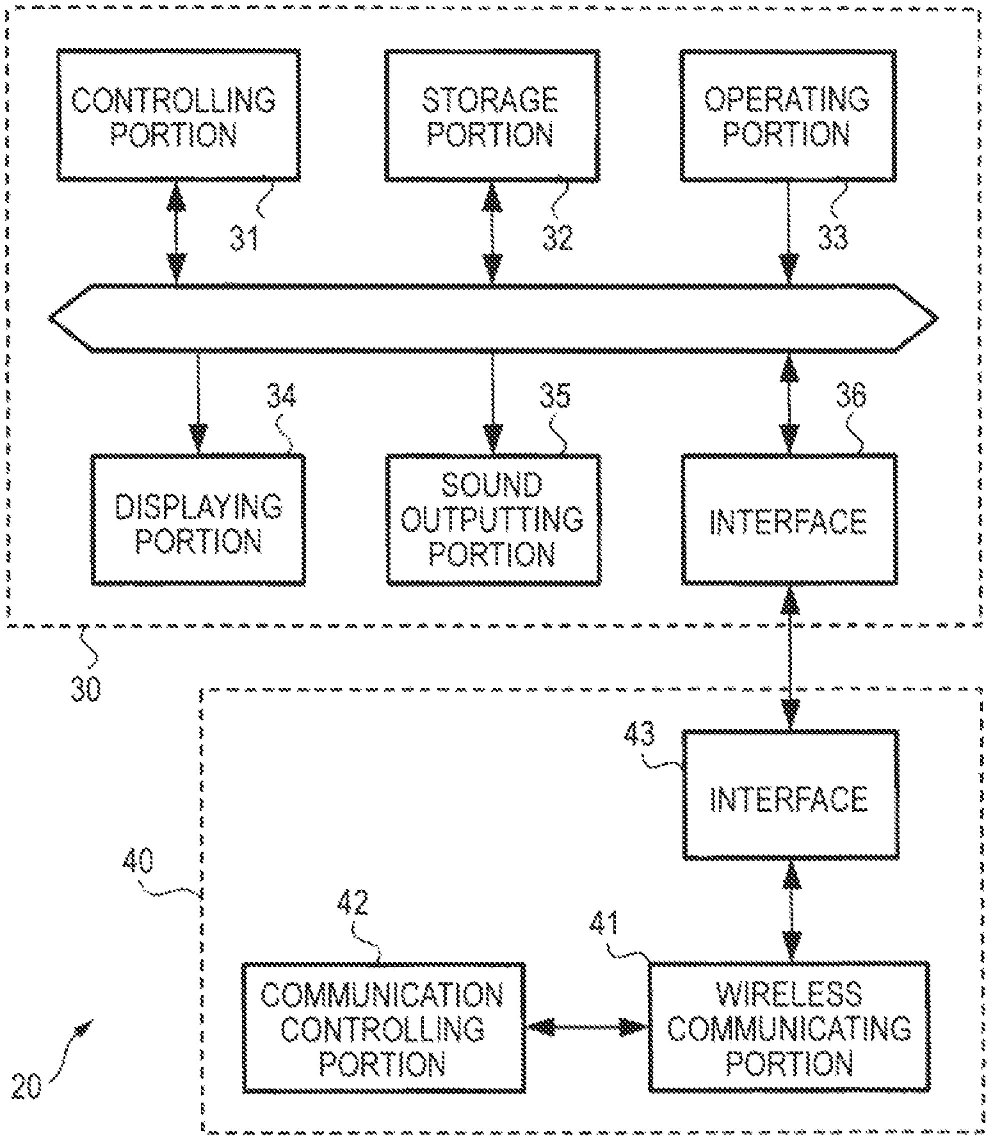
FIG. 3 is a block diagram illustrating the configuration of an audio apparatus in the embodiment.

FIG. 3 is a block diagram illustrating the configuration of the audio apparatus 20. As described above, the audio apparatus 20 is configured by connecting the portable audio terminal 30 to the communication module 40 through interfaces 36, 43. In the example, when the communication module 40 is connected to the portable audio terminal 30, the module is supplied with an electric power from a power supplying portion (not shown) in the portable audio terminal 30 through the interfaces 36, 43. When the communication module 40 is disconnected from the portable audio terminal 30 and the connection is cancelled, therefore, the functions of the portions of the audio apparatus 20 are stopped. Hereinafter, the configurations of the portions will be sequentially described.

The portable audio terminal 30 includes a controlling portion 31, a storage portion 32, an operating portion 33, a displaying portion 34, a sound outputting portion 35, and the interface 36.

The portions are connected to one another through a bus. The controlling portion 31 includes a CPU, a ROM, and a RAM. The CPU loads a control program from the ROM into the RAM, and executes the program to control the portions of the portable audio terminal 30 through the bus. The contents of the control by the controlling portion 31 will be described later.

The storage portion 32 is storage means such as a hard disk or a nonvolatile memory, and stores audio data indicating a musical sound waveform signal corresponding to contents such as a music piece or a movie, or video data indicating a video image. The storage portion 32 further stores the instruction value information indicating an instruction value Lp which instructs the volume value. In this example, the range of the instruction value Lp is from "0" to "100". The range is not limited to this, and may be expressed by, for example, 8 bits or from "0" to "255". This is applicable also to the set value Ls which will be described later. In the case where the use range is varied depending on the apparatus, the range for each apparatus may be specified by communication so that the values are previously made correspondent with each other.

The operating portion 33 has an operating device which is to be operated (for example, rotated, or pressed) by the user, and, when the user operates the operating device, outputs an operation signal indicative of contents of the operation to the controlling portion 31. According to the operation, various instructions can be issued. For example, instructions for activating the portable audio terminal 30, and those for selecting and reproducing contents stored in the storage portion 32 can be issued. The user issues instructions for increasing or decreasing the volume value (or those for directly indicating the volume value), by means of the operation of the operating device.

The displaying portion 34 is a displaying device such as a liquid crystal display having a menu screen, a setting screen, and a displaying screen on which a video image of the contents or the like is displayed, and performs a display in accordance with video data which are supplied by the control of the controlling portion 31. Furthermore, an image (a bar graph, numerals, or the like) indicating the volume value corresponding to the instruction value information stored in the storage portion 32 is displayed under control of the controlling portion 31.

The sound outputting portion 35 has a connecting terminal to which sound emitting means such as a headphone is connected, and supplies the musical sound waveform signal of sound data which are input under control of the controlling portion 31, to the connected sound emitting means. At this time, the musical sound waveform signal which is input into the sound outputting portion 35 has been subjected by the controlling portion 31 to an amplifying process corresponding to the instruction value Lp stored in the storage portion 32.

The interface 36 is a connecting terminal to which an external apparatus is connected to input and output various kinds of information, data, and the like. In the example, the communication module 40 is connected to the interface 36, and, under control of the controlling portion 31, audio data, the instruction value information, and the like are supplied to the connected communication module 40. The set value information which is externally input, and the like are supplied to the controlling portion 31, through the interface 36.

In accordance with a user's operation on the operating portion 33, the controlling portion 31 reads the audio data stored in the storage portion 32, supplies the audio data to the interface 36, applies an amplifying process on the musical sound waveform signal related to the audio data, and outputs the amplified signal to the sound outputting portion 35. When instructions for increasing or decreasing the volume value are issued in response to a user's operation on the operating portion 33, the controlling portion 31 updates the instruction value information stored in the storage portion 32 to a value corresponding to the instructions. Then, the controlling portion 31 outputs the updated instruction value information to the interface 36.

The output of the instruction value information may be performed each time when update is conducted, or periodically performed. Alternatively, the output may be performed when the connection between the audio apparatus 20 and the speaker apparatuses 10 by wireless communication is informed from the communication module through the interface 36. In the example, the output of the instruction value information is performed periodically, and also when update is conducted.

At this time, the controlling portion 31 may obtain information indicative of whether the connection state of the speaker apparatuses 10 and the audio apparatus 20 is attained or not, from the communication module 40. If the connection state is attained, the controlling portion 31 may stop the output of the musical sound waveform signal to the sound outputting portion 35, and, if the connection state is not attained, may stop the outputs of the audio data and the instruction value information to the interface 36.

When the set value information is supplied from the interface 36, the controlling portion 31 updates the instruction value information stored in the storage portion 32, in accordance with the set value information. In the example, the instruction value information is updated so that the set value Ls indicated by the set value information is changed to the instruction value Lp.

The communication module 40 has a wireless communicating portion 41, a communication controlling portion 42, and the interface 43. The wireless communicating portion 41 has a function of, under control of the communication controlling portion 42, performing wireless communication with the speaker apparatuses 10. The interface 43 is a connecting terminal to which an external apparatus is connected, and through which various data are input and output. In the example, the interface 43 is connected to the portable audio terminal 30, and sends the audio data and instruction value information supplied from the interface 36 of the portable audio terminal 30, to the wireless communicating portion 41. Furthermore, the set value information which is output from the wireless communicating portion 41 as described later is supplied to the interface 36 of the portable audio terminal 30.

The functions of the wireless communicating portion 41 and the communication controlling portion 42 are substantially identical with those of the wireless communicating portion 111 and the communication controlling portion 112 of the speaker apparatuses 10, and hence only different points will be described. When receiving the control signal Sc from the speaker apparatuses 10, the wireless communicating portion 41 decodes the signal, and supplies the set value information contained in the control signal Sc to the interface 43. As a result, the set value information is output to the controlling portion 31 through the interface 36.

The wireless communicating portion 41 transmits the audio data St which are obtained by encoding the audio data supplied from the interface 43 through interface 36, to the speaker apparatuses 10 constituting the network. Furthermore, the wireless communicating portion 41 transmits the control signal Sc containing the instruction value information supplied from the interface 43, the connection situation information output from the communication controlling portion 42, and the like, to the speaker apparatuses 10 constituting the network.

The communication controlling portion 42 controls the above-described communication operations in the wireless communicating portion 41, such as exchanges in the establishment of the wireless communication, the connection to the speaker apparatuses 10 by wireless communication, and transmission and reception after the connection.

The communication controlling portion 42 stores the connection situation information indicative of the number of the speaker apparatuses 10 (that of the speaker apparatuses 10 constituting the network) connected by wireless communication, and, when the wireless communicating portion 41 transmits the control signal Sc containing the instruction value information, controls so that the signal contains also the connection situation information. In the case where the objects of the speaker apparatuses 10 which are connected to the audio apparatus 20 by wireless communication are changed, namely, the speaker apparatuses 10 constituting the network are changed, the communication controlling portion 42 causes the wireless communicating portion 41 to transmit the control signal Sc containing the instruction value information, to the connected speaker apparatuses 10. Even in the case where the instruction value information is not periodically output from the interface 43, the communication controlling portion 42 may buffer the instruction value information which is finally output, and the control signal Sc containing the instruction value information may be periodically transmitted from the wireless communicating portion 41.

The connection situation information may not indicate the number of the speaker apparatuses 10 connected by wireless communication, and may indicate identifiers identifying the speaker apparatuses 10. The connection situation information may have any kind of contents as far as the information indicates whether the number of the speaker apparatuses 10 connected to the audio apparatus 20 by wireless communication is a plural number or not. The case where the connection situation information indicates that the number of the speaker apparatuses 10 is not a plural number means the case where only one speaker apparatus is connected to the audio apparatus 20. The configuration of the audio apparatus 20 has been described.

[Volume Controlling Function]

Returning to FIG. 2, next, the volume controlling function which is realized in the controlling portion 14 of each of the speaker apparatuses 10 will be described. The volume controlling function is a function of controlling the volume of the own apparatus in accordance with the instruction value information received from the audio apparatus 20. The configurations in the volume controlling function which will be described later may be realized by hardware.

In order to realize the volume controlling function, configurations of a setting storage portion 141, a sound processing portion 142, a table storage portion 143, an instruction changing portion 144, an operation changing portion 145, and a table determining portion 146 are used.

The setting storage portion 141 stores the set value information indicative of the set value Ls of the volume value which is to be set in the sound processing portion 142. In the case where the connection situation information output from the wireless communicating portion 111 indicates that the number of the speaker apparatuses 10 is not a plural number, the setting storage portion 141 outputs the stored set value information to the wireless communicating portion 111. Also in the case where the connection situation information indicates that the number of the speaker apparatuses 10 is not a plural number, and the contents of the set value information are updated by the operation changing portion 145, the setting storage portion 141 outputs the set value information to the wireless communicating portion 111.

The audio data St output from the wireless communicating portion 111 are input into the sound processing portion 142. The sound processing portion 142 applies an amplifying process on the musical sound waveform signal related to the audio data St at the amplification factor corresponding to the set value Ls indicated by the set value information stored in the setting storage portion 141, and outputs the musical sound waveform signal in which the output level is adjusted by the amplifying process, to the sound emitting portion 13. At this time, various acoustic processes such as addition of a sound field effect may be applied, and a process of further adjusting the output level by a dynamic range compression process may be performed. These processes may be performed in different manners in the speaker apparatuses 10-1, 10-2.

The audio data which are input into the sound processing portion 142 may not be the audio data St supplied from the wireless communicating portion 111, and may be audio data which are input from an external apparatus, or those which, in the case where a tuner or sound source that produces audio data exists in the apparatus, are supplied from the internal apparatus. Namely, the sound processing portion 142 may be configured so as to emit a sound even when the speaker apparatus is not connected to the audio apparatus 20 by wireless communication.

The table storage portion 143 stores a table (hereinafter, referred to as a conversion table) for determining a correspondence relationship between the instruction value Lp indicated by the instruction value information received from the audio apparatus 20, and the set value Ls indicated by the set value information stored in the setting storage portion 141. The conversion table is a table used when the set value Ls is updated on the basis of the instruction value Lp supplied from the audio apparatus 20 as described later. The conversion table stores correspondence relationships shown in, for example, FIGS. 5A to 5C, and will be described in detail later.

The instruction changing portion 144 obtains instruction value information and connection situation information which are output from the wireless communicating portion 111. In the case where the connection situation information indicates that the number of the speaker apparatuses 10 is not a plural number, the instruction changing portion 144 updates the set value information so that the volume set value Ls indicated by the set value information stored in the setting storage portion 141 coincides with the instruction value Lp indicated by the obtained instruction value information.

By contrast, in the case where the connection situation information indicates that the number of the speaker apparatuses 10 is a plural number, the conversion table is updated so as to attain the correspondence relationship which is determined by a table determining process as described later. Therefore, the instruction changing portion 144 refers the updated conversion table stored in the table storage portion 143, and specifies the set value Ls corresponding to the instruction value Lp indicated by the obtained instruction value information. Then, the instruction changing portion 144 updates the set value information so that the set value Ls indicated by the set value information stored in the setting storage portion 141 coincides with the specified set value Ls.

When an operation signal indicative of instructions for increasing or decreasing the set value Ls is output from the operating portion 12, the operation changing portion 145 updates the set value information so that the set value Ls indicated by the set value information stored in the setting storage portion 141 coincides with the set value Ls corresponding to the instructions. The operation changing portion 145 sends a notification indicative of the completion of the update to the table determining portion 146.

When predetermined conditions are satisfied, the table determining portion 146 performs the table determining process to update the conversion table stored in the table storage portion 143 so that a table of the determined correspondence relationships is obtained. The satisfaction of predetermined conditions means a case in which, when receiving the notification indicative of the completion of the update from the operation changing portion 145, the state where the number of the speaker apparatuses 10 is not a plural number, indicated by the connection situation information output from the wireless communicating portion 111 is changed to that where the number is a plural number.

The table determining process is a process in which the instruction value Lp indicated by the latest instruction value information output from the wireless communicating portion 111 is compared with the set value Ls indicated by the set value information stored in the setting storage portion 141, and the correspondence relationships of the conversion table are determined in accordance with a result of the comparison.

[Table Determining Process]

Figure 4:
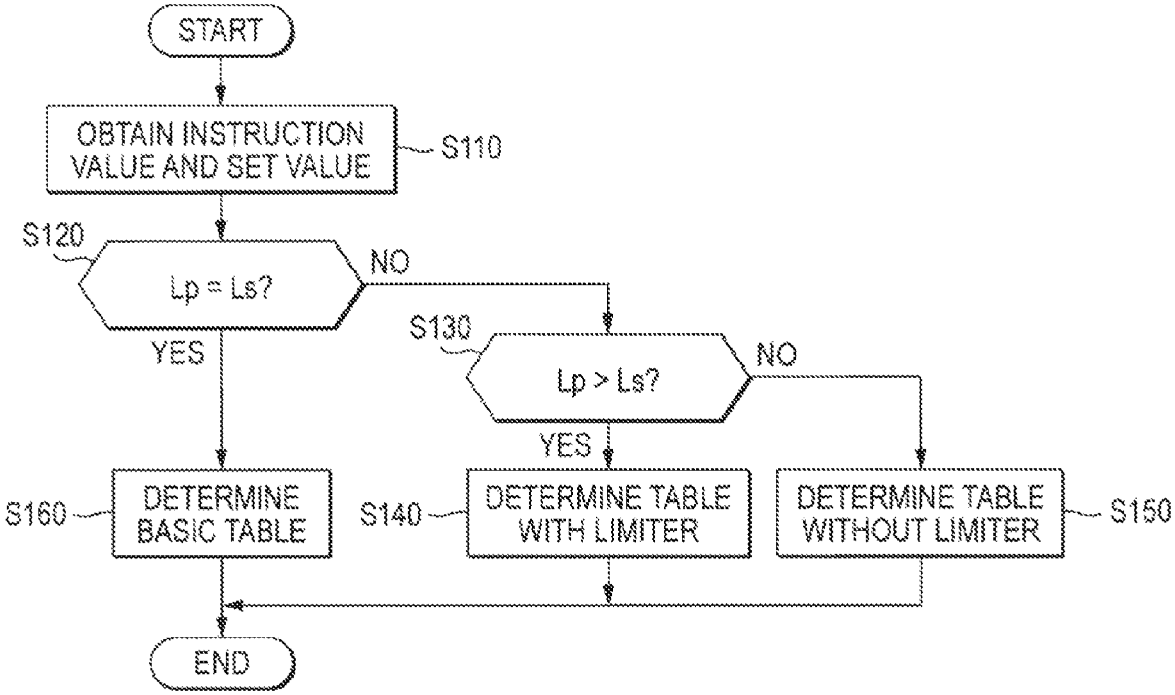
FIG. 4 is a flowchart illustrating a table determining process in the embodiment.

FIG. 4 is a flowchart illustrating the table determining process. First, the table determining portion 146 obtains the instruction value Lp indicated by the latest instruction value information output from the wireless communicating portion 111, and the set value Ls indicated by the set value information stored in the setting storage portion 141 (step S110). The latest instruction value information may be obtained by buffering the latest one of the instruction value information output from the wireless communicating portion 111, or may be instruction value information which is contained in the control signal Sc together with the connection situation information that functions as a trigger for starting the table determining process.

The table determining portion 146 compares the obtained instruction value Lp with the set value Ls (step S120), and, if the values are different from each other (step S120: No), further compares the magnitude relationship (step S130).

If the instruction value Lp is larger than the set value Ls (step S130: Yes), the table determining portion 146 determines correspondence relationships which attain a table with a limiter (step S140), and ends the table determining process. By contrast, if the instruction value Lp is smaller than the set value Ls (step S130: No), the table determining portion 146 determines correspondence relationships which attain a table without a limiter (step S150), and ends the table determining process.

If the instruction value Lp is equal to the set value Ls (step S120: Yes), the table determining portion 146 determines correspondence relationships which attain a basic table (step S160), and ends the table determining process.

Next, the table with a limiter, the table without a limiter, and the basic table will be described with reference to FIGS. 5A to 5C.

Figure 5A:
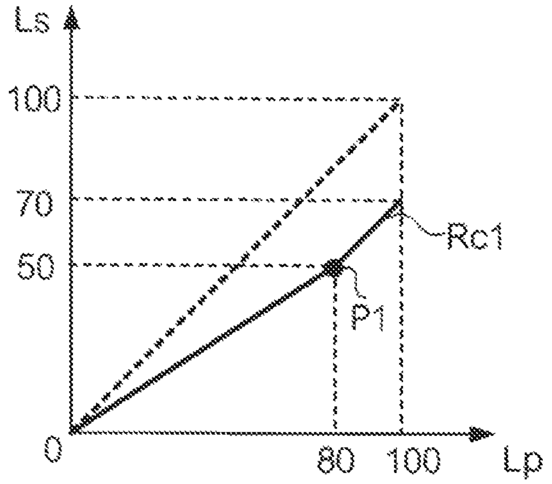
FIGS. 5A to 5C are views illustrating examples of a correspondence relationship according to the kind of a table which is determined in the table determining process.
Figure 5B:
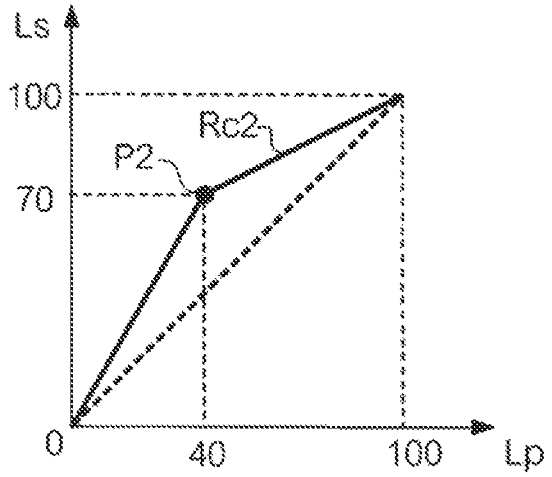
Figure 5C:
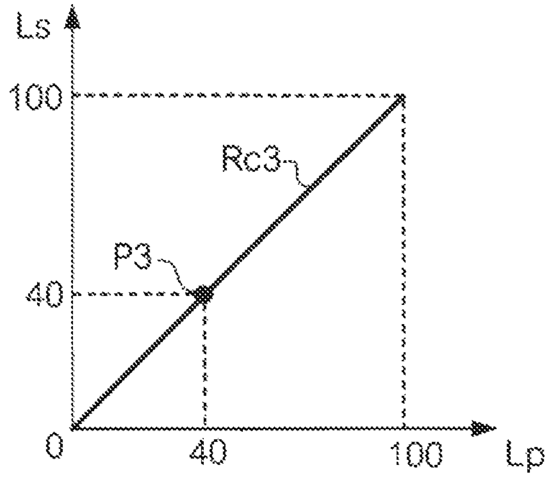

FIGS. 5A to 5C are views illustrating examples of the correspondence relationship according to the kind of the table which is determined in the table determining process.

The table with a limiter shows a correspondence relationship Rc1 in which, even when the instruction value Lp is the maximum value of "100", the corresponding set value Ls is not the maximum value as shown in FIG. 5A. The correspondence relationship Rc1 has: a relationship (corresponding to the point P1 in the figure) in which the instruction value Lp that is a comparison object is made correspondent with the set value Ls that is a comparison object; a relationship (a proportional relationship in the case where the inclination is "smaller than 1") in which, when the instruction value Lp is decreased from the relationship, also the set value Ls is decreased at the decreasing rate; and a relationship (a proportional relationship in which the inclination is "1") in which, when the instruction value Lp is increased, also the set value Ls is increased by the increased numerical value.

When the instruction value Lp is "0", therefore, also the set value Ls is "0". In the relationship between the instruction value Lp and set value Ls that are comparison objects, however, Lp> Ls as described above. Even when the instruction value Lp is "100", therefore, the set value Ls does not reach "100". In the case where, when the speaker apparatus 10 is connected to the audio apparatus 20, the set value Ls has a value which is smaller than the instruction value Lp, it is often that the speaker apparatus 10 can be originally used at a small volume set value, and, even when the instruction value Lp is increased, the set value Ls can be prevented from being excessively increased. When the instruction value Lp is decreased to "0", also the set value Ls becomes "0", and a mute state can be set.

The specific example shown in FIG. 5A indicates the correspondence relationship Rc1 which is determined in the case where the instruction value Lp that is a comparison object is "80" and the set value Ls is "50" (point P1: Lp> Ls). In this case, in the range of the instruction value Lp of from "0" to "80", a correspondence relationship in which the set value Ls is changed from "0" to "50" (a proportional relationship in which the inclination is "0.625 (=50/80)") is obtained. By contrast, in the range of the instruction value Lp of from "80" to "100", a correspondence relationship in which the set value Ls is changed from "50" to "70" (a proportional relationship in which the inclination is "1") is obtained.

The table without a limiter shows a correspondence relationship Rc2 in which, when the instruction value Lp is the maximum value of "100", the corresponding set value Ls is the maximum value "100" as shown in FIG. 5B. The correspondence relationship Rc2 has: a relationship (corresponding to the point P2 in the figure) in which the instruction value Lp that is a comparison object is made correspondent with the set value Ls that is a comparison object; a relationship (a proportional relationship in the case where the inclination is "larger than 1") in which, when the instruction value Lp is decreased from the relationship, also the set value Ls is decreased at the decreasing rate; and a relationship (a proportional relationship in the case where the inclination is "smaller than 1") in which, when the instruction value Lp is increased, also the set value Ls is increased at the increasing rate.

When the instruction value Lp is "0", therefore, also the set value Ls is "0", and, when the instruction value Lp is "100", the set value Ls is "100". In the case where, when the speaker apparatus 10 is connected to the audio apparatus 20, the set value Ls has a value which is larger than the instruction value Lp, it is often that the speaker apparatus 10 can be originally used at a large volume set value, and, when the instruction value Lp is increased to the maximum value, also the set value Ls can be set to the maximum value, and, when the instruction value Lp is decreased to "0", also the set value Ls becomes "0", and a mute state can be set.

The specific example shown in FIG. 5B indicates the correspondence relationship Rc2 which is determined in the case where the instruction value Lp that is a comparison object is "40" and the set value Ls is "70" (point P2: Lp<Ls). In this case, in the range of the instruction value Lp of from "0" to "40", a correspondence relationship in which the set value Ls is changed from "0" to "70" (a proportional relationship in which the inclination is "1.75 (=70/40)") is obtained. By contrast, in the range of the instruction value Lp of from "40" to "100", a correspondence relationship in which the set value Ls is changed from "70" to "100" (a proportional relationship in which the inclination is "0.5 (=30/60)") is obtained.

The basic table shows a correspondence relationship Rc3 in which the instruction value Lp=the set value Ls is attained as shown in FIG. 5C. The specific example shown in FIG. 5C indicates the correspondence relationship Rc3 which is determined in the case where the instruction value Lp that is a comparison object is "40" and also the set value Ls is "40" (point P3: Lp=Ls). In the correspondence relationship Rc1 or Rc2 in the above-described table with a limiter or table without a limiter, depending on the position of the point P1 or P2, its shape is changed. In the basic table, by contrast, the correspondence relationship Rc3 is always constant irrespective of the position of the point P3.

Theses tables are an example. The correspondence relationship may be determined by an algorithm which is different from the above (for example, determined by a nonlinear relationship in place of a proportional relationship, or a correspondence relationship in which a table without a limiter is obtained irrespective of the magnitude relationship between the instruction value Lp and the set value Ls). Preferably, the correspondence relationship is determined by a relationship in which the instruction value Lp that is a comparison object is made correspondent with the set value Ls that is a comparison object, so that, when the speaker apparatus 10 is connected to the audio apparatus 20, the set value Ls is not suddenly changed. These algorithms in the speaker apparatuses 10-1, 10-2 may be different from each other. The table determining process has been described.

Returning to FIG. 2, the description is continued. The table determining portion 146 updates the conversion table stored in the table storage portion 143 so as to become a correspondence relationship table which is determined by the table determining process. The volume controlling function has been described.

[Operation]

Next, the operations of the speaker apparatuses 10 and the audio apparatus 20 in a situation where the audio system is changed in the sequence of FIG. 1A, FIG. 1B, and FIG. 1C as described above will be described. In the description, it is assumed that the initial state is a state before the speaker apparatus 10-1 and the audio apparatus 20 are connected to each other by wireless communication as shown in FIG. 1A.

Figure 6:
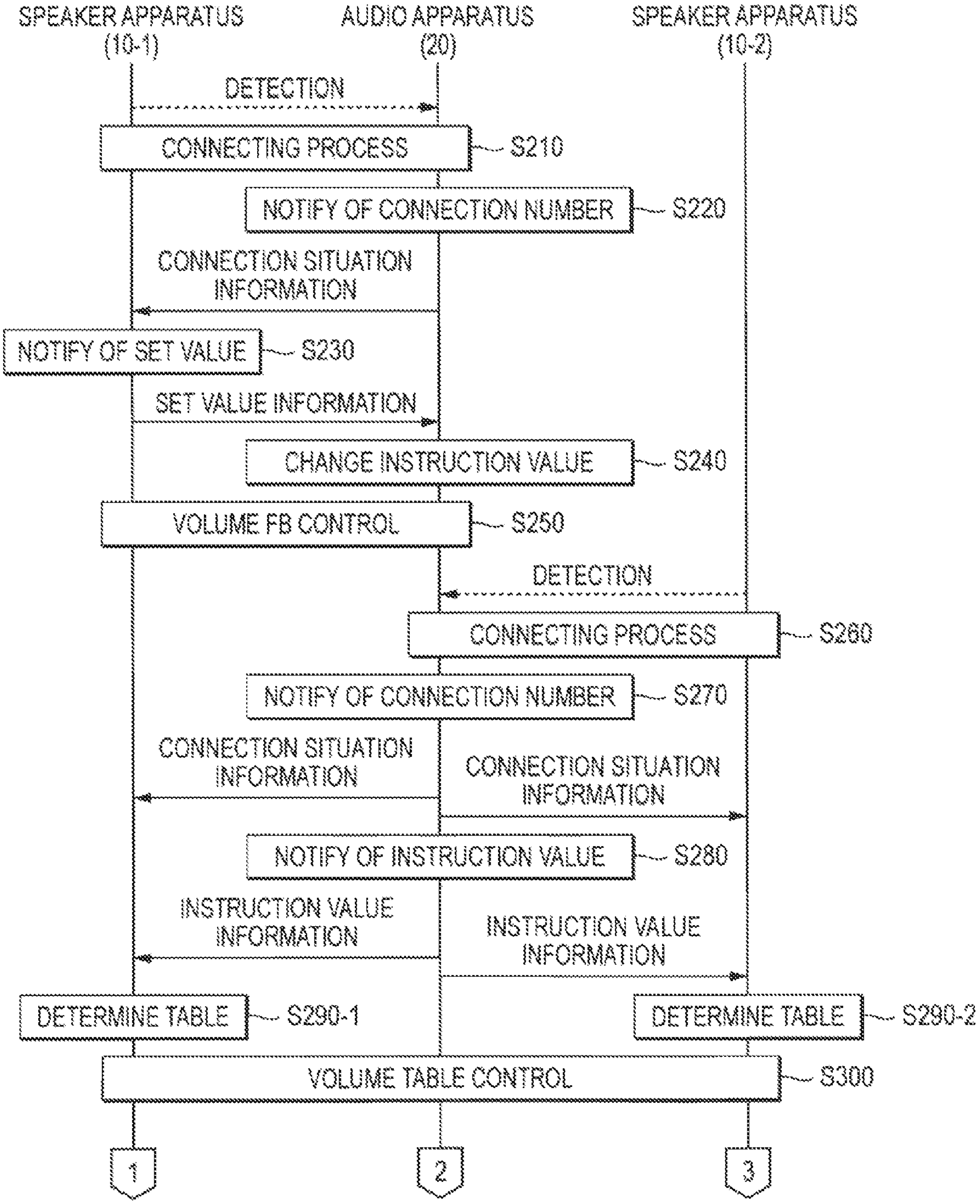
FIG. 6 is a view illustrating an example of the operation of the audio system in the embodiment.
Figure 7:
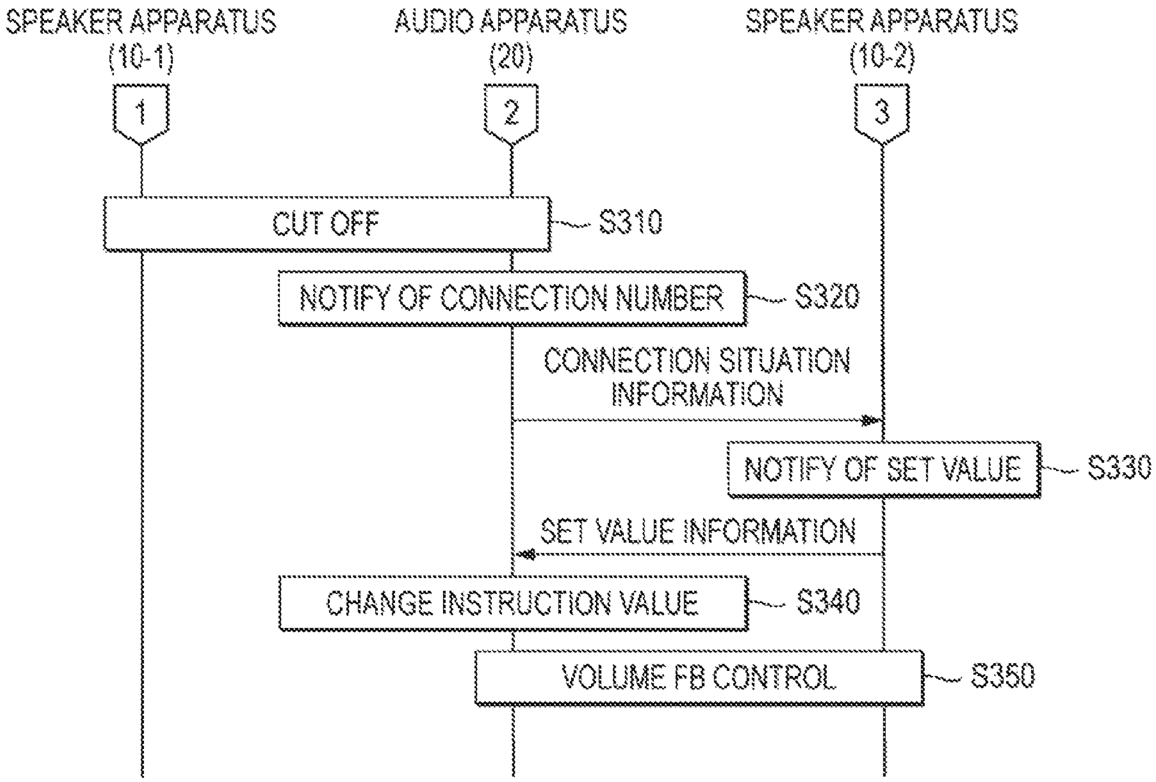
FIG. 7 is a view illustrating an example of a portion subsequent to FIG. 6.
Figure 8:
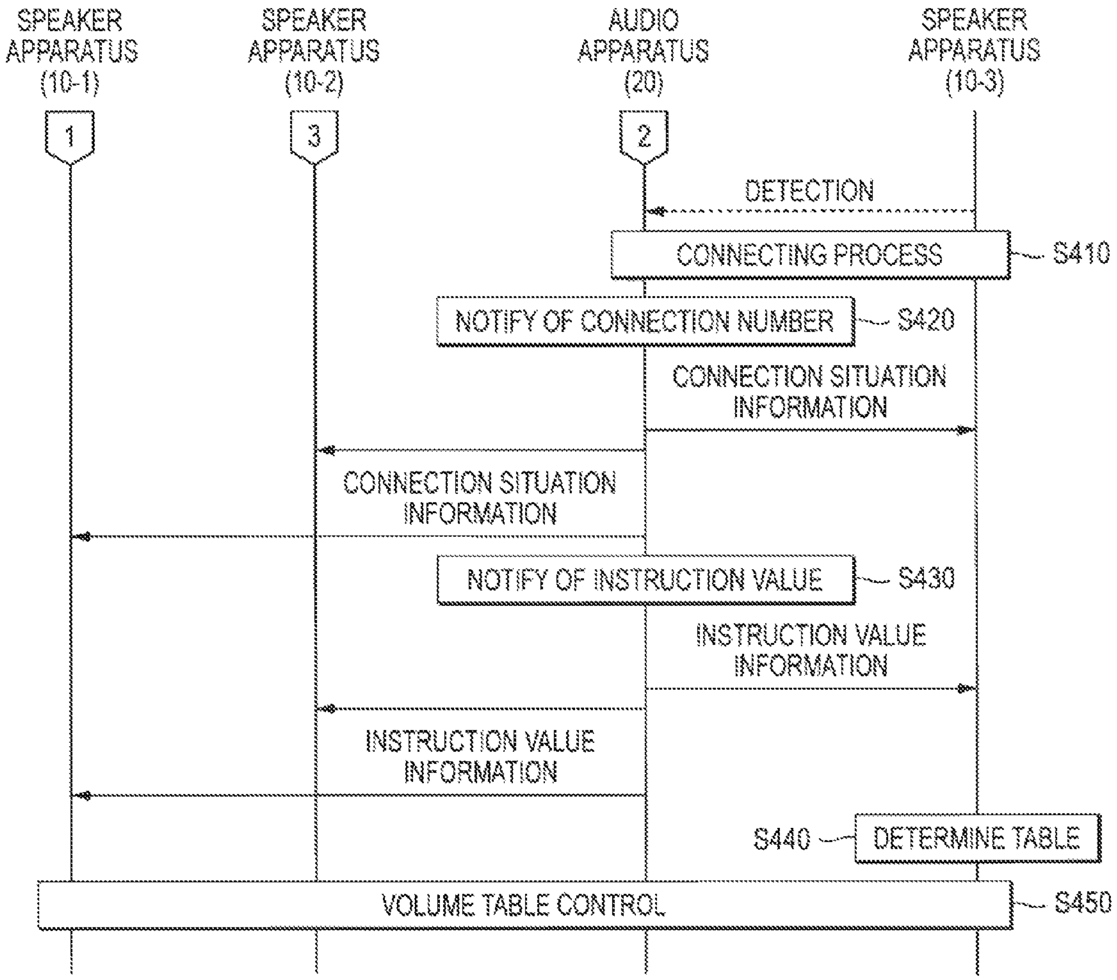
FIG. 8 is a view illustrating another example of the portion subsequent to FIG. 6.

FIGS. 6, 7, and 8 are views illustrating an example of the operation of the audio system. First, description will be made with reference to FIG. 6.

When the speaker apparatus 10-1 detects that the audio apparatus 20 exists within the communication range, the speaker apparatus 10-1 and the audio apparatus 20 perform a process of conducting a wireless communication connection to be connected to each other (step S210). Alternatively, when the audio apparatus 20 detects that the speaker apparatus 10-1 exists within the communication range, the process of conducting a wireless communication connection may be performed.

The objects of the speaker apparatuses 10 which are connected to the audio apparatus 20 by wireless communication are changed, and hence the audio apparatus 20 transmits the control signal Sc containing the connection situation information to the speaker apparatus 10-1 to notify of the number of the speaker apparatuses 10 connected to the audio apparatus 20 (step S220).

When the speaker apparatus 10-1 recognizes that the connection situation information indicates that the number of the speaker apparatuses 10 is not a plural number (one speaker apparatus is connected), the speaker apparatus transmits the control signal Sc containing the set value information stored in the setting storage portion 141, to the audio apparatus 20 to notify of the set value Ls (step S230). The set value information indicates the set value Ls which is set in the speaker apparatus 10-1 before the connection with the audio apparatus 20.

The audio apparatus 20 changes the instruction value Lp indicated by the instruction value information stored in the storage portion 32 to the notified set value Ls (step S240), to update the instruction value information.

As a result, the instruction value Lp indicated by the instruction value information stored in the storage portion 32 is equal to the set value Ls indicated by the set value information stored in the setting storage portion 141 of the speaker apparatus 10-1, and a volume feedback (FB) control between the audio apparatus 20 and the speaker apparatus 10-1 is started (step S250).

The volume FB control is a control which will be described below. When the instruction value Lp indicated by the instruction value information stored in the storage portion 32 is changed by operating the operating portion 33 of the audio apparatus 20, the set value Ls indicated by the set value information stored in the setting storage portion 141 of the speaker apparatus 10-1 is changed by the instruction changing portion 144, and the instruction value Lp and the set value Ls become equal to each other. At this time, the table determining portion 146 may determine so that the conversion table stored in the table storage portion 143 is the correspondence relationships of the basic table, and the instruction changing portion 144 may change the set value Ls stored in the setting storage portion 141 in accordance with the conversion table. Also in the alternative, the same process result is obtained.

By contrast, when the set value Ls indicated by the set value information stored in the setting storage portion 141 is changed by operating the operating portion 12 of the speaker apparatus 10-1, the control signal Sc containing the set value information is transmitted by the wireless communicating portion 111, and the instruction value Lp indicated by the instruction value information stored in the storage portion 32 of the audio apparatus 20 is changed. Therefore, the instruction value Lp and the set value Ls become equal to each other.

The control in which, even when instructions for changing the volume value are conducted in the operating portion of any of the apparatuses, the instruction value Lp and the set value Ls are synchronized and coincident with each other as described above is called the volume FB control.

Next, when the state shown FIG. 1A is changed to that shown in FIG. 1B, and the speaker apparatus 10-2 detects that the audio apparatus 20 exists within the communication range, the speaker apparatus 10-2 and the audio apparatus 20 perform a process of conducting a wireless communication connection to be connected to each other (step S260). The objects of the speaker apparatuses 10 which are connected by wireless communication are changed, and hence the audio apparatus 20 transmits the control signal Sc containing the connection situation information to the speaker apparatuses 10-1, 10-2 to notify of the number of the speaker apparatuses 10 connected to the audio apparatus 20 (step S270). Since the notified number is a plural number (two speaker apparatuses are connected), the audio apparatus 20 transmits the control signal Sc containing the instruction value information stored in the storage portion 32, thereby notifying of the instruction value Lp (step S280).

When the control signal Sc containing the connection situation information is to be transmitted, the audio apparatus 20 may cause the signal to contain also the instruction value information so as to conduct the notification of the instruction value Lp together with that of the number of connections.

When the speaker apparatuses 10-1, 10-2 receive the control signal Sc and recognize that the connection situation information indicates that the number of the speaker apparatuses 10 is a plural number (two speaker apparatuses are connected), the speaker apparatuses start the table determining process in the table determining portion 146, and determine the correspondence relationship of the conversion table stored in the table storage portion 143 (steps S290-1, S290-2).

At this time, it is assumed that the instruction value Lp notified in step S280 is "80". When the instruction value Lp is notified, therefore, the set value Ls in the speaker apparatus 10-1 is synchronized by the volume FB control, and hence has the same value or "80". On the other hand, it is assumed that the set value Ls in the speaker apparatus 10-2 when the instruction value Lp is notified is "50". Under this relationship, the correspondence relationship which is determined in the table determining process by the speaker apparatus 10-1 is as shown FIG. 5C, and by contrast that which is determined in the table determining process by the speaker apparatus 10-2 is as shown FIG. 5A. The set value Ls in the speaker apparatus 10-2 is "50" before the connection is performed by wireless connection, but not changed to "80" which is the value of the instruction value Lp after the connection, and maintained to "50". Therefore, the sound volume is not suddenly changed from that which is used at the last time, and, in the case where a sound other than the audio data St is emitted, the sound volume is not suddenly changed.

Then, a volume table control between the audio apparatus 20 and the speaker apparatuses 10-1, 10-2 is started (step S300).

The volume table control is a control which will be described below. When the instruction value Lp indicated by the instruction value information stored in the storage portion 32 is changed by operating the operating portion 33 of the audio apparatus 20, the instruction changing portion 144 of each of the speaker apparatuses 10-1, 10-2 refers the conversion table stored in the table storage portion 143 to specify the set value Ls corresponding to the instruction value Lp, and changes the set value Ls indicated by the set value information stored in the setting storage portion 141, to the specified set value Ls. By contrast, when the set value Ls indicated by the set value information stored in the setting storage portion 141 is changed by operating the operating portion 12 of the speaker apparatus 10-1 or 10-2, the table determining process in the table determining portion 146 is performed, and the conversion table is updated.

The above-described control in which, when instructions for changing the volume value is performed by operating the operating portion 33 of the audio apparatus 20, the set value Ls of each of the speaker apparatuses 10-1, 10-2 is changed in accordance with the conversion table, and, when instructions for changing the volume value is performed by operating the operating portion 12 of the speaker apparatus 10-1 or 10-2, the conversion table is updated while changing the set value Ls in accordance with the instructions is called the volume table control. Specific examples of the volume table control in the case where the correspondence relationship of the conversion table is determined as in the above-described example will be described with reference to FIGS. 9A to 11C.

Figure 9A:
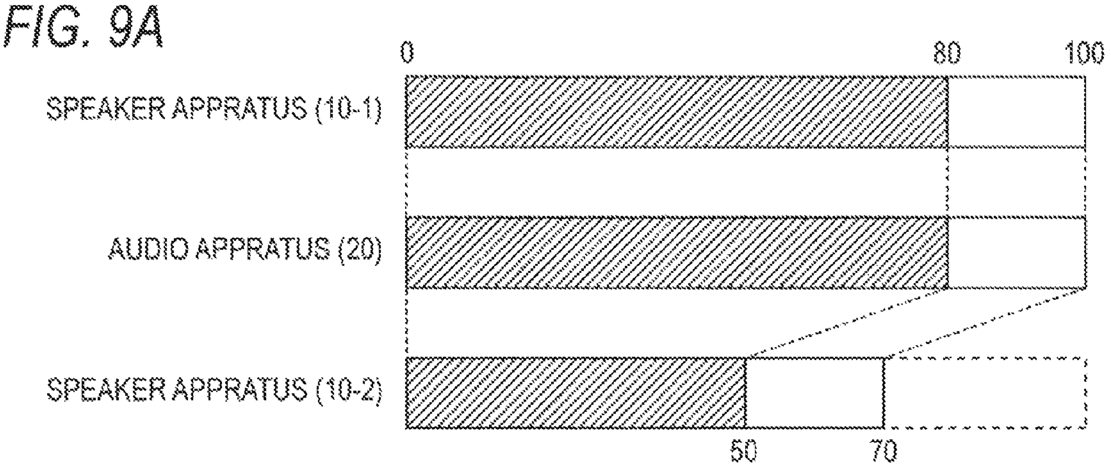
FIGS. 9A to 9C are views illustrating specific examples of relationships between an instruction value and set value in apparatuses in a volume table control.
Figure 9B:
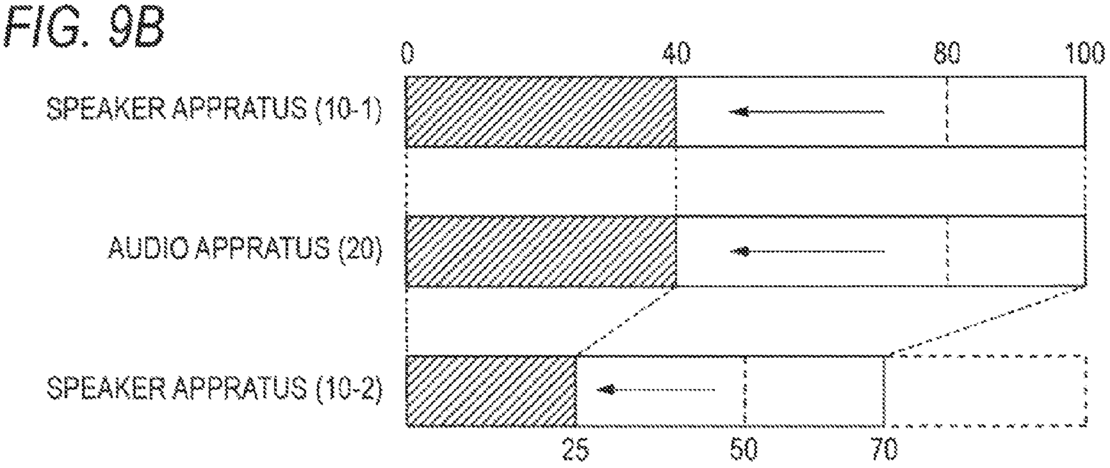
Figure 9C:
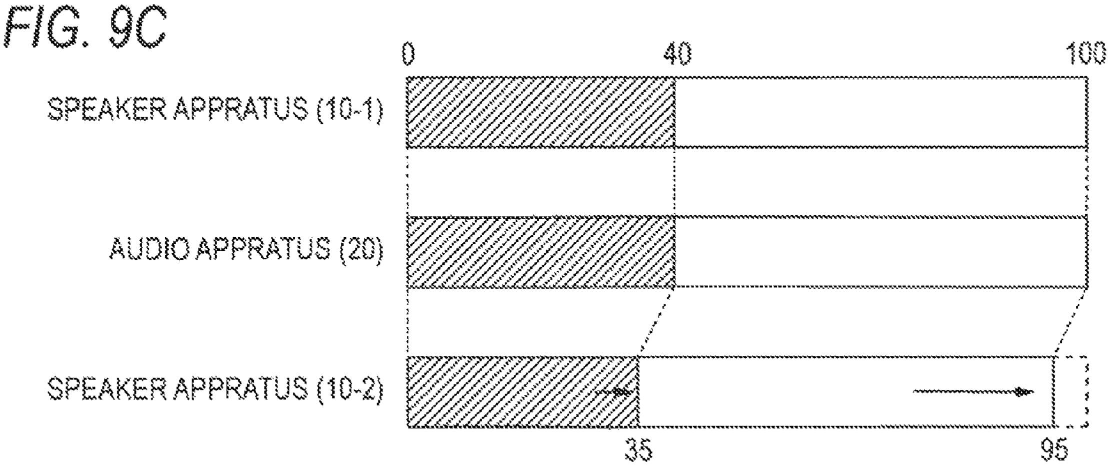

FIGS. 9A to 11C are views illustrating specific examples of relationships between the instruction value Lp and set value Ls of the volumes of the apparatuses in the volume table control. In the figures, the set values Ls of the speaker apparatuses 10-1, 10-2 and the instruction value Lp of the audio apparatus 20 are shown, and, in the case where the set value Ls which is the upper limit in the conversion table exists, a portion which is equal to or larger than the value is indicated by a broken line. In FIG. 9A, for example, the upper limit of the set value Ls of the speaker apparatus 10-2 is "70". Moreover, FIG. 9A shows that the instruction value Lp of the audio apparatus 20 is "80", and the set values Ls of the speaker apparatuses 10-1, 10-2 are "80" and "50", respectively.

First, the instruction value Lp is changed from the state shown in FIG. 9A to "40" by operating the operating portion 33 of the audio apparatus 20. Then, the speaker apparatus 10-1 refers the conversion table of the correspondence relationship Rc3 shown in FIG. 5C, and changes the set value Ls to "40" corresponding to the instruction value Lp of "40". By contrast, the speaker apparatus 10-2 refers the conversion table of the correspondence relationship Rc1 shown in FIG. 5A, and changes the set value Ls to "25" corresponding to the instruction value Lp of "40" (see FIG. 9B). In the case where the instruction value Lp is changed to "100", the set value Ls of the speaker apparatus 10-2 is increased to "70", but not changed to a larger value.

When the set value Ls is then changed to "35" by operating the operating portion 12 of the speaker apparatus 10-2, the speaker apparatus 10-2 performs the table determining process to change the correspondence relationship of the conversion table. At this time, the changed correspondence relationship is determined in accordance with a result of the comparison between the instruction value Lp of "40" and the set value Ls of "35". Since the range to the upper limit of the instruction value Lp is "+60", the upper limit of the set value Ls at this time is "95 (=35+60)" (see FIG. 9C).

Figure 10A:
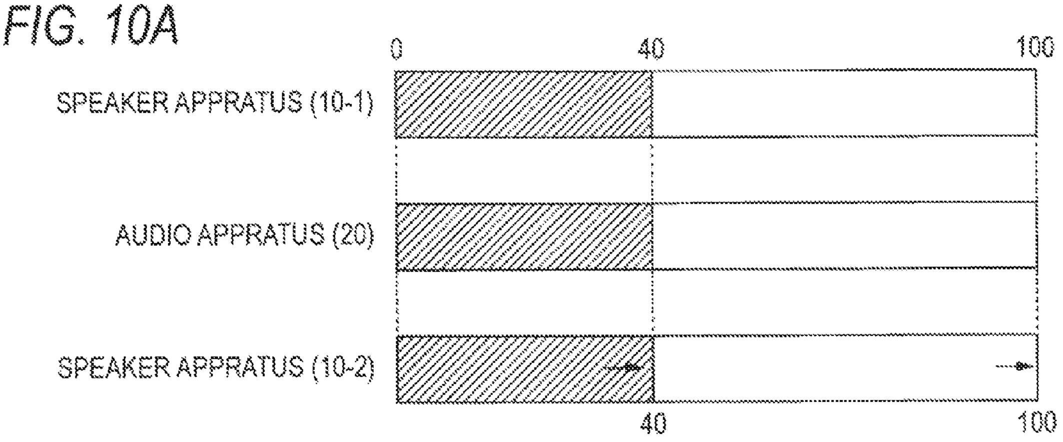
FIGS. 10A to 10C are views illustrating specific examples of portions subsequent to FIGS. 9A to 9C.
Figure 10B:
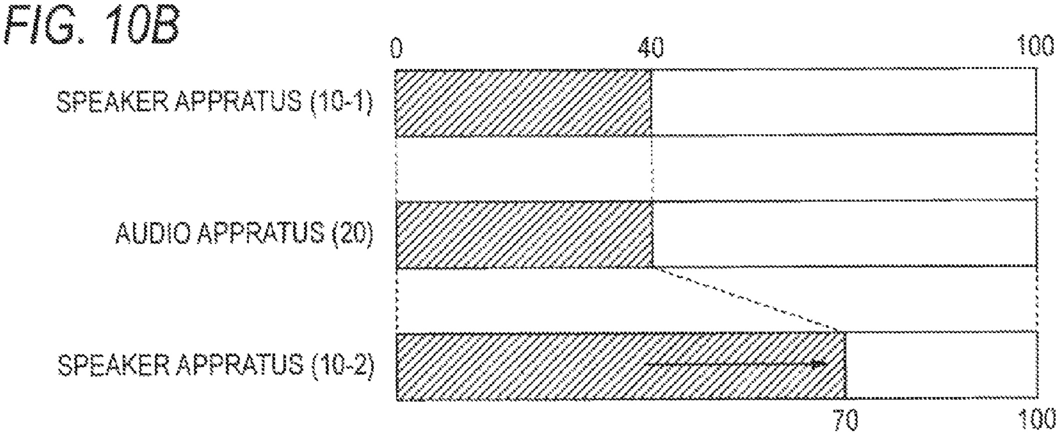
Figure 10C:
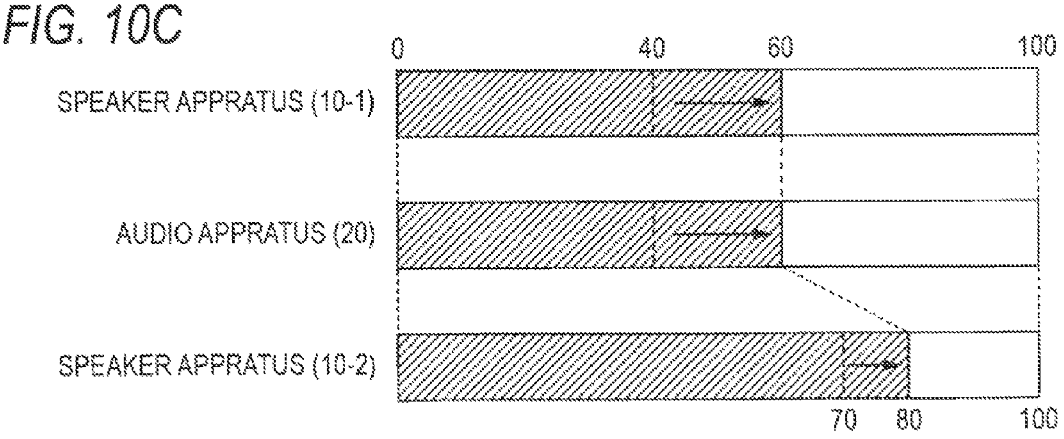

Thereafter, the set value Ls is further increased to "40" to attain the state shown in FIG. 10A. At this time, the correspondence relationship of the conversion table is as shown in FIG. 5C. In this example, it is assumed that the set value Ls is further increased to "70" (FIG. 10B). In this state, the speaker apparatus 10-2 determines the changed correspondence relationship in accordance with a result of the comparison between the instruction value Lp of "40" and the set value Ls of "70". As a result, the conversion table in the speaker apparatus 10-2 has the correspondence relationship Rc2 such as shown in FIG. 5B.

When the instruction value Lp is then changed from the state shown in FIG. 10B to "60" by operating the operating portion 33 of the audio apparatus 20, the speaker apparatus 10-1 refers the conversion table of the correspondence relationship Rc3 shown in FIG. 5C, and changes the set value Ls to "60" corresponding to the instruction value Lp of "60". By contrast, the speaker apparatus 10-2 refers the conversion table of the correspondence relationship Rc2 shown in FIG. 5B, and changes the set value Ls to "80" corresponding to the instruction value Lp of "60" (see FIG. 10C).

Figure 11A:
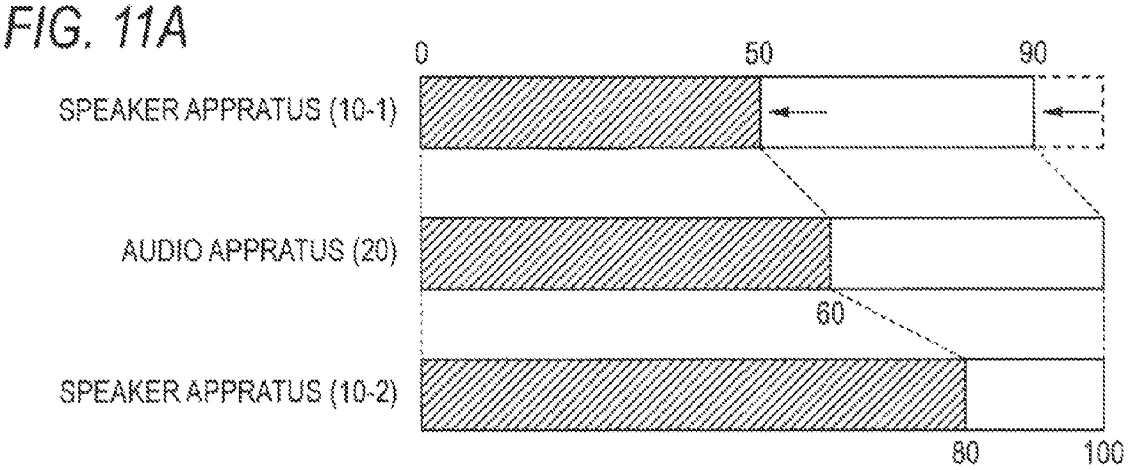
FIGS. 11A to 11C are views illustrating specific examples of portions subsequent to FIGS. 10A to 10C.
Figure 11B:
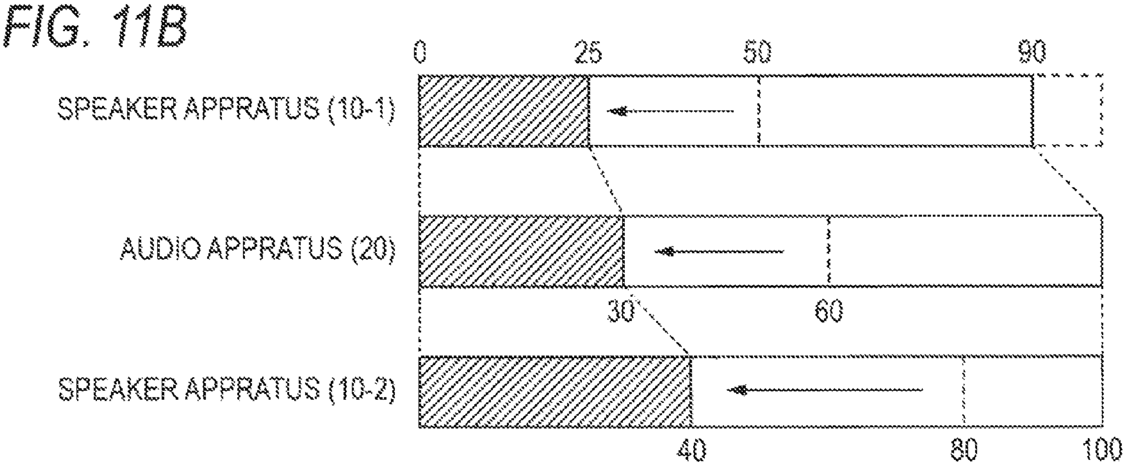
Figure 11C:
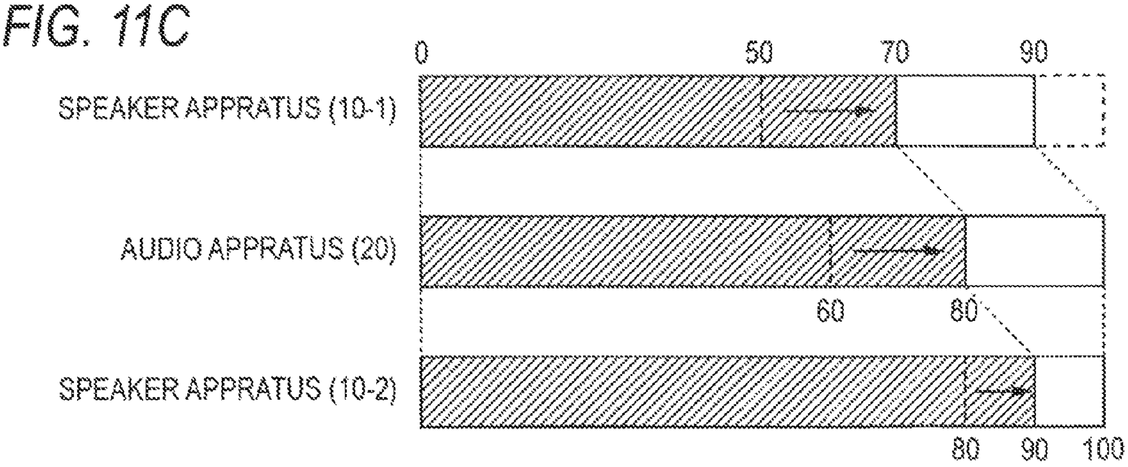

When the set value Ls is then changed from "60" to "50" by operating the operating portion 12 of the speaker apparatus 10-1, the speaker apparatus 10-1 performs the table determining process to change the correspondence relationship of the conversion table. At this time, the changed correspondence relationship (hereinafter, referred to as the correspondence relationship Rc4) is determined in accordance with a result of the comparison between the instruction value Lp of "60" and the set value Ls of "50". Since the range to the upper limit of the instruction value Lp is "+40", the upper limit of the set value Ls at this time is "90 (=50+40)" (see FIG. 11A). FIGS. 11B and 11C show the case where the instruction value Lp is then changed to "30" by operating the operating portion 33 of the audio apparatus 20, and that where the instruction value is then changed to "80", respectively. In the above, specific examples of the volume table control have been described.

Returning to the description of the operations of the speaker apparatuses 10 and the audio apparatus 20, the description is continued. The case where, when the volume table control (step S300) in FIG. 6 is performed (the state of FIG. 1B), the state of FIG. 1C is attained will be described with reference to FIG. 7. At this time, the connection between the audio apparatus 20 and the speaker apparatus 10-1 by wireless communication is cut off (step S310). As a result of this cut-off, the audio apparatus 20 recognizes that the objects of the speaker apparatuses 10 which are connected by wireless communication are changed, and transmits the control signal Sc containing the connection situation information to the speaker apparatus 10-2, thereby notifying of the number of the speaker apparatuses 10 connected to the audio apparatus 20 (step S320).

When the speaker apparatus 10-2 recognizes that the connection situation information indicates that the number of the speaker apparatuses 10 is not a plural number (one speaker apparatus is connected), the speaker apparatus transmits the control signal Sc containing the set value information stored in the setting storage portion 141, to the audio apparatus 20 to notify of the set value Ls (step S330). The set value information indicates the set value Ls which is set in the speaker apparatus 10-2 at the last time by the volume table control.

The audio apparatus 20 changes the instruction value Lp indicated by the instruction value information stored in the storage portion 32 to the notified set value Ls (step S340), to update the instruction value information. Then, a volume feedback (FB) control between the audio apparatus 20 and the speaker apparatus 10-2 is started (step S350).

In the following, the case where, when the volume table control (step S300) in FIG. 6 is performed (the state of FIG. 1B), a speaker apparatus 10-3 is further connected in wireless communication will be described with reference to FIG. 8.

When the speaker apparatus 10-3 detects that the audio apparatus 20 exists within the communication range, the speaker apparatus 10-3 and the audio apparatus 20 perform a process of conducting a wireless communication connection to be connected to each other (step S410). The objects of the speaker apparatuses 10 which are connected by wireless communication are changed, and hence the audio apparatus 20 transmits the control signal Sc containing the connection situation information to the speaker apparatuses 10-1, 10-2, 10-3 to notify of the number of the speaker apparatuses 10 connected to the audio apparatus 20 (step S420). Since the notified number is a plural number (three speaker apparatuses are connected), the audio apparatus 20 transmits the control signal Sc containing the instruction value information stored in the storage portion 32, thereby notifying of the instruction value Lp (step S430).

When the speaker apparatus 10-3 receives the control signal Sc and recognizes that the connection situation information indicates that the number of the speaker apparatuses 10 is a plural number (three speaker apparatuses are connected), the speaker apparatus starts the table determining process in the table determining portion 146, and determines the correspondence relationship of the conversion table stored in the table storage portion 143 (step S440). By contrast, the speaker apparatuses 10-1, 10-2 receive the control signal Sc and recognize that the connection situation information indicates that the number of the speaker apparatuses 10 is a plural number (three speaker apparatuses are connected), but the state where a plurality of speaker apparatuses are connected is not changed. Therefore, the speaker apparatuses do not perform the table determining process by using the reception as a trigger.

Then, the above-described volume table control between the audio apparatus 20 and the speaker apparatuses 10-1, 10-2, 10-3 is performed (step S450). In the above, the operations of the speaker apparatuses 10 and the audio apparatus 20 have been described.

In the audio system of the embodiment of the invention, as described above, in the case where, when the speaker apparatus 10 is connected to the audio apparatus 20 by wireless communication, the audio apparatus 20 is already connected to another speaker apparatus 10, the speaker apparatus 10 determines the correspondence relationship between the instruction value Lp and the set value Ls in accordance with a result of the comparison between the instruction value Lp of the volume in the audio apparatus 20 and the set value Ls in the speaker apparatus 10, and controls the volume value in accordance with the correspondence relationship. In the correspondence relationship, the instruction value Lp and set value Ls that are comparison objects are correlated to each other.

Therefore, in the case where the volume value that is set in the speaker apparatus 10 is remotely controlled by the audio apparatus 20, even when the number of the speaker apparatuses 10 to be controlled is increased, it is possible to control the volumes of the whole speaker apparatuses 10 to be controlled, while the parameter that is set in the newly added speaker apparatus 10 is prevented from being suddenly changed by the instruction value Lp of the audio apparatus 20.

<Modifications>

Although the embodiment of the invention has been described, the invention may be implemented in various modes as described below.

[Modification 1]

In the above-described embodiment, the audio apparatus 20 is configured so as to transmit the audio data St. When a configuration for transmitting and receiving the control signal Sc is provided, the audio apparatus may be configured so as not to transmit the audio data St. In this case, the speaker apparatuses 10 may obtain audio data from the own apparatus or another external apparatus.

Namely, the audio apparatus 20 does not transmit the audio data St, and is requested to have a function of an instructing device such as a remote controller which notifies the speaker apparatuses 10 of the instruction value Lp of the volume.

[Modification 2]

In the above-described embodiment, the speaker apparatuses 10-1, 10-2 have the sound emitting portion 13. Alternatively, each speaker apparatus may be configured so as not to have the sound emitting portion 13. An amplifying process is performed in accordance with the set value Ls. The process is not limited to an amplifying process. The invention may be applied to various acoustic processes such as an equalizing process and a sound field effect adding process. In the case of a sound field effect adding process, for example, the addition degree may be changed in accordance with the set value Ls.

As described above, the speaker apparatuses 10-1, 10-2 are one mode of the acoustic processing apparatus which applies an acoustic process on input audio data. Namely, the acoustic processing apparatus of the invention may be one of various apparatuses such as an AV amplifier and a television receiver.

[Modification 3]

In the above-described embodiment, when one speaker apparatus 10 is connected to the audio apparatus 20, the volume FB control is performed. Alternatively, a different control may be performed. For example, the set value Ls is changed in accordance with an operation on the audio apparatus 20, but an operation on the speaker apparatuses 10 may be made invalid.

[Modification 4]

The control program in the above-described embodiment may be provided in the state where the program is stored in a computer-readable recording medium such as a magnetic recording medium (a magnetic tape, a magnetic disk, or the like), an optical recording medium (an optical disk or the like), a magnetooptical disk, or a semiconductor memory. In this case, reading means for reading a recording medium may be disposed in the speaker apparatus 10. Alternatively, the control program may be downloaded through the Internet.

According to an aspect of the invention, in the case where a parameter that is set in an acoustic processing apparatus and that is used for applying an acoustic process is remotely controlled by an instructing device, even when the number of acoustic processing apparatuses to be controlled is increased, it is possible to control parameters of the whole acoustic processing apparatuses to be controlled, while the parameter that is set in the newly added acoustic processing apparatus is prevented from being suddenly changed by an instruction value of the instructing device.

What is claimed is:

1. An acoustic processing apparatus comprising:

a connecting unit to which an instructing device is connected by wireless communication;

a situation obtaining unit which, when the instructing device is connected to the connecting unit, obtains information indicative of whether a number of apparatuses connected to the instructing device by wireless communication is a plural number or not, from the instructing device;

a receiving unit which receives a first instruction value of an audio value from the instructing device;

a storage unit in which a set value of the audio value is stored;

a determining unit which, in a case where the information indicates that the number of apparatuses connected to the instructing device is a plural number, compares the first instruction value and the set value, and determines correspondence relationship between the first instruction value and the set value in accordance with a result of comparison of the first instruction value and the set value;

a first changing unit which, when the receiving unit receives a second instruction value of the audio value after the correspondence relationship is determined, specifies a set value of the audio value which corresponds to the second instruction value received after the correspondence relationship is determined, based on the correspondence relationship, and changes the set value stored in the storage unit to the specified set value in the storage unit; and an acoustic processing unit which applies an acoustic process on an input audio data in accordance with the set value in the storage unit.

2. The acoustic processing apparatus according to claim 1, wherein the determining unit determines the correspondence relationship so that the set value specified by the first changing unit is equal to the second instruction value received by the receiving unit.

3. The acoustic processing apparatus according to claim 1, further comprising:

an instructing unit which generates an instruction for changing the set value; and a second changing unit which changes the set value in the storage unit in accordance with the instruction, wherein in the case where the information indicates that the number of apparatuses connected to the instructing device is a plural number, when the set value is changed by the second changing unit, the determining unit compares the set value changed by the second changing unit and the second instruction value, and updates the correspondence relationship in accordance with a result of comparison of the set value changed by the second changing unit and the second instruction value.

4. The acoustic processing apparatus according to claim 1, further comprising:

a transmitting unit, wherein when the number of apparatuses connected to the instructing device is changed, the situation obtaining unit obtains the information from the instructing device, in a case where the information indicates that the number of apparatuses connected to the instructing device is not a plural number, the transmitting unit transmits the set value in the storage unit to the instructing device, and, even after the correspondence relationship is determined by the determining unit, the first changing unit changes the set value in the storage unit to the first instruction value received by the receiving unit.

* * * * *